(12) United States Patent
Hyun et al.

(10) Patent No.: US 9,112,055 B2
(45) Date of Patent: Aug. 18, 2015

(54) SEMICONDUCTOR DEVICE AND METHOD OF FABRICATING THE SAME

(71) Applicant: SAMSUNG ELECTRONICS CO., LTD., Suwon-Si, Gyeonggi-Do (KR)

(72) Inventors: Sung-Woo Hyun, Seoul (KR); Sun-Ghil Lee, Goyang-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 326 days.

(21) Appl. No.: 13/733,312

(22) Filed: Jan. 3, 2013

(65) Prior Publication Data
US 2013/0280871 A1    Oct. 24, 2013

(30) Foreign Application Priority Data

Apr. 19, 2012  (KR) .................. 10-2012-0041032

(51) Int. Cl.
*H01L 21/8238*   (2006.01)
*H01L 29/66*     (2006.01)
*H01L 29/78*     (2006.01)
*H01L 29/10*     (2006.01)
*H01L 21/02*     (2006.01)
*H01L 29/51*     (2006.01)

(52) U.S. Cl.
CPC ............ *H01L 21/823807* (2013.01); *H01L 21/823814* (2013.01); *H01L 21/823864* (2013.01); *H01L 29/1054* (2013.01); *H01L 29/6656* (2013.01); *H01L 29/66575* (2013.01); *H01L 29/66628* (2013.01); *H01L 29/7834* (2013.01); *H01L 21/02362* (2013.01); *H01L 29/517* (2013.01)

(58) Field of Classification Search
CPC ............... H01L 21/02362; H01L 21/823807
USPC ........................................... 438/217
See application file for complete search history.

(56) References Cited

U.S. PATENT DOCUMENTS

| | | | |
|---|---|---|---|
| 6,271,551 B1 * | 8/2001 | Schmitz et al. | 257/288 |
| 6,713,359 B1 | 3/2004 | Mizushima et al. | |
| 7,217,627 B2 | 5/2007 | Kim | |
| 7,888,747 B2 | 2/2011 | Hokazono | |
| 2003/0052348 A1 * | 3/2003 | Takagi et al. | 257/288 |
| 2007/0238255 A1 * | 10/2007 | Miyano et al. | 438/301 |
| 2010/0087043 A1 * | 4/2010 | Cheng et al. | 438/424 |
| 2011/0227094 A1 | 9/2011 | Wahl et al. | |

FOREIGN PATENT DOCUMENTS

| | | |
|---|---|---|
| JP | 10093076 | 4/1998 |
| JP | 2010278484 | 12/2010 |
| KR | 1998057099 | 9/1998 |
| KR | 1020010087474 A | 9/2001 |
| KR | 1020090071768 A | 7/2009 |

* cited by examiner

*Primary Examiner* — Karen Kusumakar
(74) *Attorney, Agent, or Firm* — Volentine & Whitt, PLLC

(57) ABSTRACT

A method of fabricating a semiconductor device includes performing pre-halo ion implantation on a semiconductor substrate, forming a first epitaxial layer over the entire upper surface of the semiconductor substrate, forming a second epitaxial layer over the entire surface of the first epitaxial layer, and forming a transistor at an active region of the second epitaxial layer. The first epitaxial layer prevents the ions implanted in the semiconductor substrate in the pre-halo implantation process from diffused into the second epitaxial layer under the effects of a process used to form the transistor.

15 Claims, 9 Drawing Sheets

SEMICONDUCTOR DEVICE AND METHOD OF FABRICATING THE SAME

PRIORITY STATEMENT

This application claims priority from Korean Patent Application No. 10-2012-0041032 filed on Apr. 19, 2012 in the Korean Intellectual Property Office, and all the benefits accruing therefrom under 35 U.S.C. 119, the contents of which are hereby incorporated by reference in their entirety.

BACKGROUND

The inventive concept relates to semiconductor devices and to methods of fabricating the same. In particular, the inventive concept relates to halo implantation processes used in the fabricating of semiconductor devices.

The rapid growth of electronic products that process information, such as computers, has brought about a rapid progress in the development of semiconductor devices such as semiconductor memories. These developments include increases in the integration of the devices aimed at reducing the cost of the devices without compromising their quality. Realizing a high degree of integration of semiconductor devices requires a scaling-down of existing devices, e.g., minimizing the thickness of gate oxide films of the transistors of semiconductor devices and of the channel lengths of the transistors. These reductions may result in or be accompanied by reductions in the spacing between the transistors, and in the widths of the gate regions of the transistors.

However, in these respects, electrical properties of a transistor are considerably affected by a critical dimension (CD) of its gate region. For instance, as the width of the gate region of the transistor(s) of a semiconductor device becomes smaller to increase the degree of integration of the device, the distance between the source and drain regions of the transistor also becomes smaller. This distance may correspond to the effective length of the channel through which charge carriers (electrons or holes) move when the transistor is in a certain state. However, when the effective channel length of a transistor is relatively small, so-called short channel effects can occur.

Various methods have been considered for suppressing short channel effects. One of these methods is a halo implantation process of implanting a high concentration of ions into a substrate in forming the source and drain regions of a transistor.

However, as semiconductor devices become more highly integrated and the critical dimension (CD) of a gate region decreases to meet the smaller design rules for the devices, the ions implanted during the halo ion implantation process may tend to diffuse into a channel region of a transistor, thereby negatively impacting the performance of the transistor by, for example, increasing the threshold voltage (Vth) distribution of the transistor or reducing the mobility of the charge carriers in the channel region.

SUMMARY

According to one aspect of the inventive concept, there is provided a method of fabricating a semiconductor device which includes implanting ions into a semiconductor substrate in a pre-halo ion implantation process, epitaxially growing a layer of material on the entirety of an upper surface of the semiconductor substrate to thereby form a first epitaxial layer, epitaxially growing a layer of material on the entirety of an upper surface of the first epitaxial layer to thereby form a second epitaxial layer, and forming a transistor on an active region defined in the second epitaxial layer, and in which the first epitaxial layer prevents the ions implanted in the semiconductor substrate in the pre-halo ion implantation process from diffusing into the second epitaxial layer.

According to another aspect of the present invention, there is provided a method of fabricating a semiconductor device according to the inventive concept which includes implanting ions into a semiconductor substrate in a pre-halo ion implantation process, sequentially forming a first epitaxial layer and a second epitaxial layer on the semiconductor substrate by epitaxial growth processes, forming an isolation film in the second epitaxial layer to define at least one active region after the second epitaxial layer has been formed, and forming at least one transistor at the at least one active region, and in which the first epitaxial layer prevents the ions implanted in the semiconductor substrate in the pre-halo ion implantation process from diffusing into the second epitaxial layer.

According to another aspect of the present invention, there is provided a method of fabricating a semiconductor device according to the inventive concept which includes implanting ions into a semiconductor substrate in a pre-halo ion implantation process, epitaxially growing a first layer of material on an upper surface of the semiconductor substrate, and a second layer of material on the first layer, and forming a respective transistor on each of at least one active region defined in the epitaxially grown second layer including by forming a source/drain region using a halo ion implantation process, and forming a gate structure over part of the second epitaxially grown second layer constituting a channel region of the transistor, and in which the second layer is formed after the pre-halo ion implantation process has been carried out, the composition of the second layer is substantially different from that of the first layer, and the epitaxially grown first layer prevents the ions implanted in the semiconductor substrate in the pre-halo ion implantation process from diffusing into the part of the second epitaxial layer constituting the channel region at least from the time that the second layer has been formed to the time the transistor has formed.

BRIEF DESCRIPTION OF THE DRAWINGS

The above and other features and advantages of the inventive concept will become more apparent inform the following detailed description of the preferred embodiments thereof made with reference to the attached drawings in which.

DETAILED DESCRIPTION OF THE PREFERRED EMBODIMENTS

Figure 1:
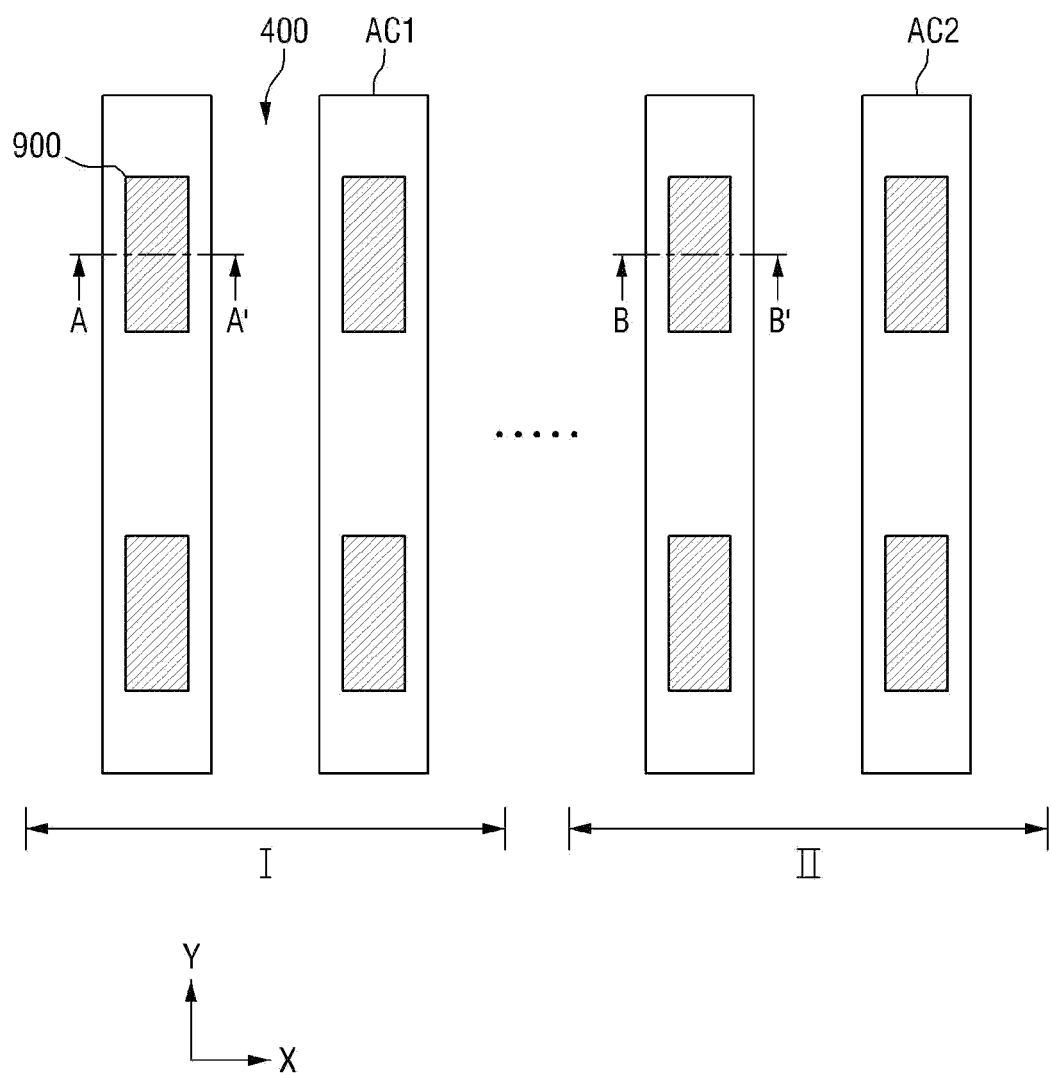
FIG. 1 is a conceptual layout diagram of a semiconductor device according to the inventive concept.

Various embodiments and examples of embodiments of the inventive concept will be described more fully hereinafter with reference to the accompanying drawings. In the drawings, the sizes and relative sizes and shapes of elements, layers and regions, such as implanted regions, shown in section may be exaggerated for clarity. In particular, the cross-sectional illustrations of the semiconductor devices and intermediate structures fabricated during the course of their manufacture are schematic. Also, like numerals are used to designate like elements throughout the drawings.

It will also be understood that when an element or layer is referred to as being "on" another element or layer, it can be directly on the other element or layer or intervening elements or layers may be present. In contrast, when an element or layer is referred to as being "directly on" another element or layer, there are no intervening elements or layers present. The drawings may, however, be relied on to fairly represent the relative disposition of layers and elements in this respect.

Furthermore, spatially relative terms, such as "upper," and "lower" are used to describe an element's and/or feature's relationship to another element(s) and/or feature(s) as illustrated in the figures. Thus, the spatially relative terms may apply to orientations in use which differ from the orientation depicted in the figures. Obviously, though, all such spatially relative terms refer to the orientation shown in the drawings for ease of description and are not necessarily limiting as embodiments according to the inventive concept can assume orientations different than those illustrated in the drawings when in use. In addition, the terms "top" or "bottom" as used to describe a surface generally refer not only to the orientation depicted in the drawings but to the fact that the surface is the uppermost or bottommost surface in the orientation depicted, as would be clear from the drawings and context of the written description.

Other terminology used herein for the purpose of describing particular examples or embodiments of the inventive concept is to be taken in context. For example, the terms "comprises" or "comprising" when used in this specification specifies the presence of stated features or processes but does not preclude the presence or additional features or processes.

A first embodiment of a semiconductor device according to the inventive concept will now be described in detail with reference to the layout diagram of FIG. 1 is and the cross-sectional view of FIG. 2

As shown in FIG. 1, the semiconductor device has a first region (I) and a second region (II). Here, the first region I may be a region where a PMOS transistor (PMOS) is located, and the second region II may be a region where an NMOS transistor (NMOS) is located.

Figure 2:
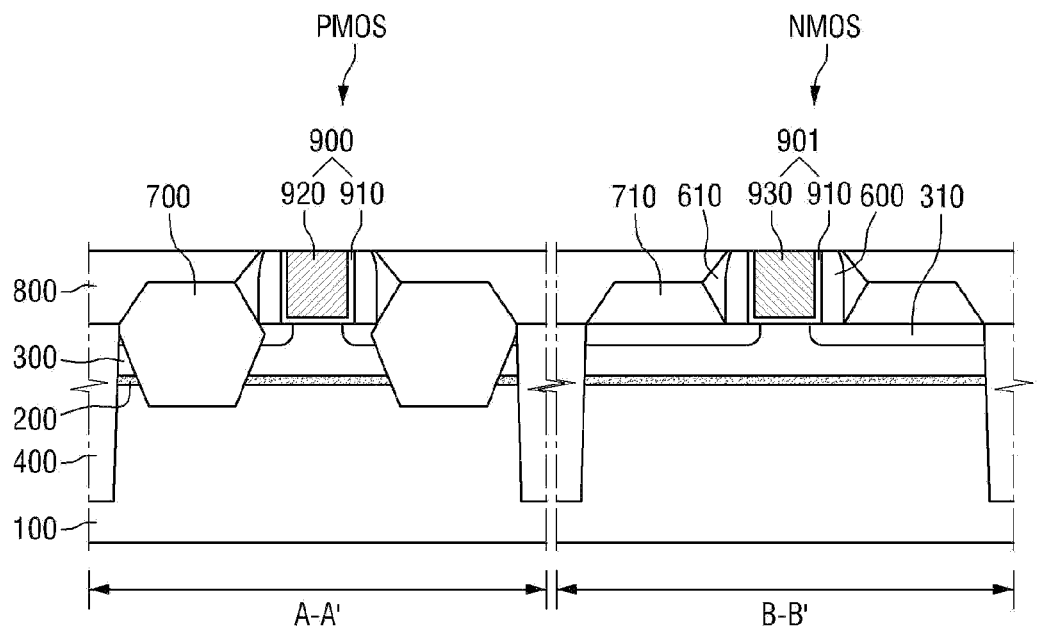
FIG. 2 is a cross-sectional view taken along lines A-A' and B-B' of FIG. 1.

As shown in FIGS. 1 and 2, semiconductor device includes a semiconductor substrate 100, and an isolation film 400 delimiting active regions AC1 and AC2 of the device, which extend parallel to one another in a first direction (in the Y direction in FIG. 1).

Furthermore, the first region I of the illustrated example of the semiconductor device of this embodiment includes a first epitaxial layer 200 formed on the semiconductor substrate 100, a second epitaxial layer 300 formed on the first epitaxial layer 200, a first section of the isolation film 400 extending through the second epitaxial layer 300 to define the first active region AC1 in the second epitaxial layer 300, and a PMOS transistor disposed at the first active region AC1. In addition, the second region II of the illustrated example of the semiconductor device includes a first epitaxial layer 200 formed on the semiconductor substrate 100, a second epitaxial layer 300 formed on the first epitaxial layer 200, a second section of the isolation film 400 extending through the second epitaxial layer 300 to define the second active region AC2 in the second epitaxial layer 300, and an NMOS transistor disposed at the second active region AC2.

The first epitaxial layer 200 may comprise silicon (Si). In an example of this embodiment, the first epitaxial layer 200 is a layer of silicon carbide (SiC). However, the inventive concept is not limited by the material constituting the first epitaxial layer 200.

The second epitaxial layer 300 constitutes the channel regions of the PMOS transistor and NMOS transistor. As shown in FIG. 2, the second epitaxial layer 300 may be thicker than the first epitaxial layer 200. Also, the second epitaxial layer 300 may comprise silicon (Si). In this example, the second epitaxial layer 300 is an Si epitaxial layer formed by an epitaxial growth process. However, again, the inventive concept is not limited by the material constituting the second epitaxial layer 300.

With respect to the above-mentioned isolation film 400, the top surface of the isolation film 400 may be at the same level as that of the second epitaxial layer 300. In other words, the top surface of the isolation film 400 may be coplanar with the top surfaces of the first and second active regions AC1 and AC2.

The PMOS transistor may include a metal gate structure 900, first and second spacers 600 and 610 both disposed on opposite sides of the metal gate structure 900, a source/drain 700 at outer sides of the second spacer 610, and a lightly doped drain (LDD) region 310.

In this case, the metal gate structure 900 may include a gate insulation film 910 and a metal gate 920. The gate insulation film 910 may be formed of a high-K dielectric material. For example, the gate insulation film 910 may be a metal oxide film. Preferably, the gate insulation film 910 is formed of $HfO_2$, $Al_2O_3$, $ZrO_2$, or $TaO_2$, but again, the inventive concept is not limited to having a PMOS transistor having a gate insulation film of any such material. The metal gate 920 may consist of a single film of a metal, a single film of a metal nitride, or a multi-layered film of a metal layer and a metal nitride layer. In addition, although not shown in detail, the metal gate 920 may comprise a metal selected for a work function that enhances the work function of the PMOS transistor.

The first spacer 600 is disposed along sidewalls of the metal gate structure 900. In the illustrated example of this embodiment, the first spacer 600 has the form of a pillar. However, the first spacer 600 may have other forms. For example, the first spacer 600 may have an L-shaped sectional profile.

The second spacer 610 is interposed between the first spacer 600 and the source/drain 700. Also, the second spacer 610 may have a wing-shape sectional profile as shown in the figure.

In another example of this embodiment, the second spacer 610 is omitted and thus, just one unitary spacer is interposed between the metal gate structure 900 and the source/drain 700.

The source/drain 700 of the PMOS transistor is, for example, an epitaxial layer. For example, the source/drain 700 is an SiGe epitaxial layer formed in the second epitaxial layer 300 by an epitaxial growth process. Moreover, the source/drain 700 extends through the LDD region 310.

The NMOS transistor may include a metal gate structure 901, first and second spacers 600 and 610 both disposed on opposite sides of the metal gate structure 901, a source/drain 710 and an LDD region 310 at outer sides of the second spacer 610, and a lightly doped drain (LDD) region 310.

In this case, the metal gate structure 901 may include a gate insulation film 910 made of a high-K dielectric material and a metal gate 930. The metal gate 930 may consist of a single film of a metal, a single film of a metal nitride, or may be a multi-layered film of a metal layer and a metal nitride layer. Furthermore, the metal gate 930 may have a composition and structure different than those of the metal gate 920 of the PMOS transistor. Also, and although not specifically illustrated, the metal gate 930 may comprise a metal whose work function is selected for enhancing that of he NMOS transistor.

The source/drain 710 of the NMOS transistor NMOS is, for example, an epitaxial layer. More specifically, the source/drain 710 of the NMOS transistor is, for example, an Si epitaxial layer formed in the second epitaxial layer 300 by an epitaxial growth process. Moreover, the source/drain 710 of the NMOS transistor NMOS is situated on the LDD region 310.

The first and second spacers 600 and 610 may be similar, in terms of form and function, to those of the first and second spacers 600 and 610 of the PMOS transistor. Likewise, the second spacer 610 of the PMOS transistor, i.e., a discrete and separately formed second spacer, may be omitted.

Hereinafter, a method of fabricating a semiconductor device according to the inventive concept will be described with reference to FIGS. 3 to 7.

Figure 3:
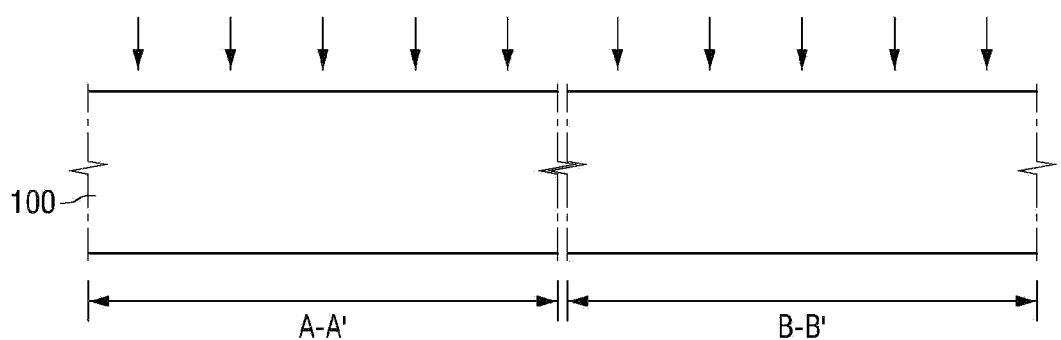
FIGS. 3 to 7 illustrate intermediate steps of a method for fabricating a semiconductor device according to the inventive concept.

First, referring to FIG. 3, ion implantation is performed on the semiconductor substrate 100 including over a first region where a PMOS transistor is to be formed (to be represented by its section A-A' hereinafter) and a second region where an NMOS transistor is to be formed (to be represented by its section B-B' hereinafter). In this embodiment, the ion implantation includes a well ion implantation process (IIP), a channel IIP, and a pre-halo IIP.

The impurities implanted by the pre-halo IIP performed on the first region A-A', where the PMOS transistor is to be formed, are N-type impurities. The impurities implanted by the pre-halo ion IIP performed on the second region B-B', where an NMOS transistor is to be formed, are P-type impurities. For example, phosphorus (P) or arsenic (As) ions may be injected into the first region A-A', and boron (B) ions may be injected into the second region B-B'. Once the ion implantation is completed, the semiconductor substrate 100 is annealed to cause the ions to diffuse further into the semiconductor substrate 100.

Figure 4:
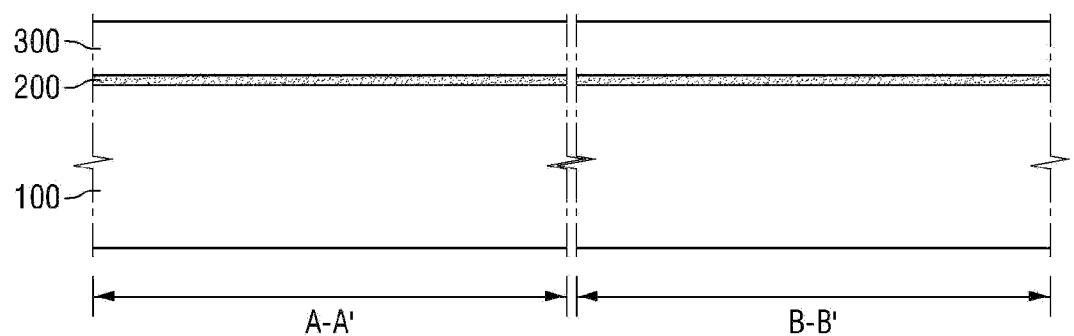

Next, and referring to FIG. 4, the first epitaxial layer 200 is formed over the entire surface of the semiconductor substrate 100 by an epitaxial growth process. Here, the first epitaxial layer 200 may be uniformly formed over the entire surfaces of the first region A-A' and the second region B-B' of the semiconductor substrate 100.

Furthermore, in this embodiment, the first epitaxial layer 200 can serve as a blocking layer for preventing the ions injected into the semiconductor substrate 100 in the pre-halo IIP (FIG. 3) from diffusing into an upper portion of the structure, as will later be described in more detail later on.

Also, the first epitaxial layer 200 may comprise silicon (Si). For example, the first epitaxial layer 200 may be a layer of silicon carbide (SiC). Thus, the first epitaxial layer 200 may be an SiC epitaxial layer formed by epitaxially growing SiC on the entire surface of the semiconductor substrate 100, rather than selectively on the semiconductor substrate 100.

Next, the second epitaxial layer 300 is formed over the entire surface of the semiconductor substrate 100 by an epitaxial growth process. The second epitaxial layer 300 may comprise silicon (Si). Thus, the second epitaxial layer 300 may be formed epitaxially growing Si on the entire surface of the first epitaxial layer 200.

Figure 5:
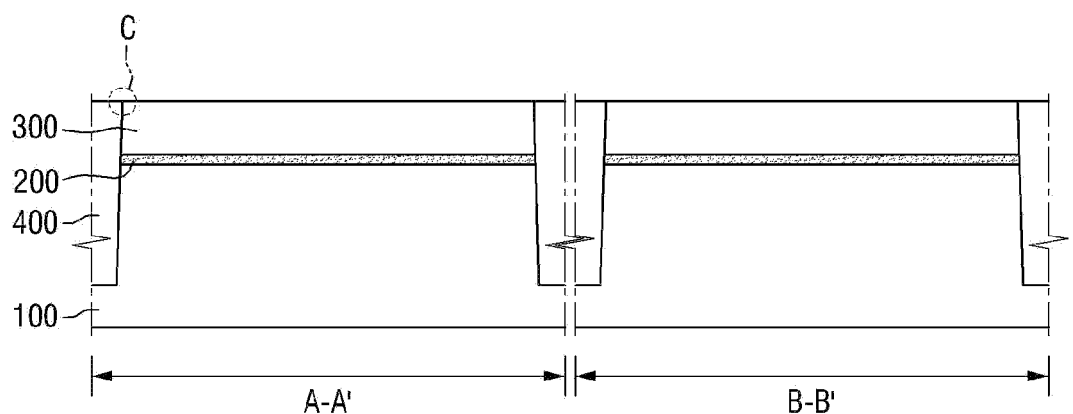

Next, and referring to FIG. 5, an isolation film 400 extending through the second epitaxial layer 300 is formed. The active regions (AC1 and AC2 of FIG. 1) of the device are defined, including in the second epitaxial layer 300, by the isolation film 400.

In an example of this embodiment, the isolation film 400 is a shallow trench isolation (STI) layer of silicon oxide. However, other types of isolation layers may be formed/used instead.

In addition, as shown in FIG. 5, the isolation film 400 may be formed to penetrate the first epitaxial layer 200. Thus, the bottom surface of the isolation film 400 may be formed at a level lower than that of the bottom surface of the first epitaxial layer 200. In addition, as is also shown in FIG. 5, the isolation film 400 may extend into the semiconductor substrate 100 beneath the first epitaxial layer 200.

Furthermore, referring to region 'C' illustrated in FIG. 5, the top surface of the second epitaxial layer 300 and the top surface of the isolation film 400 may be coplanar, i.e., situated at the same level. The reason for this is that the isolation film 400 is formed after the second epitaxial layer 300. Otherwise, it would be necessary to form the second epitaxial layer 300 by selective epitaxial growth. In that case, the top surface of the second epitaxial layer 300 would not align horizontally with that of the isolation film 400.

Figure 6:
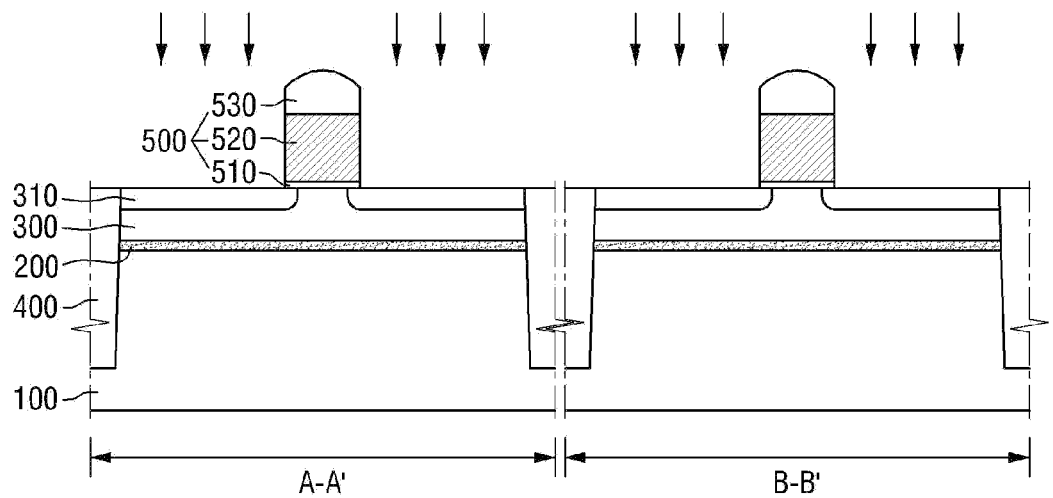

Referring now to FIG. 6, next, dummy gate structures (i.e., a dummy gate pattern) 500 are formed on active regions of the second epitaxial layer 300. More specifically, in the example of this embodiment, a buffer oxide layer (not shown), a poly gate conductive layer (not shown), and a capping layer (not shown) are sequentially formed on the second epitaxial layer 300 and patterned. As a result, buffer oxide patterns 510, polygate patterns 520 and capping layer patterns 530 are formed. Furthermore, although not shown, spacers may be formed sides of the dummy gate pattern 500.

Next, a halo implantation process is performed. In this example, impurities are injected into the active region of the second epitaxial layer 300 using the dummy gate pattern 500 as a mask, thereby forming LDD regions 310. In the above-mentioned case in which spacers are formed on sides of the dummy gate pattern 500, the LDD regions 310 are formed by injecting impurities into the active region of the second epitaxial layer 300 using the dummy gate pattern 500 and the spacers together as a mask.

Figure 7:
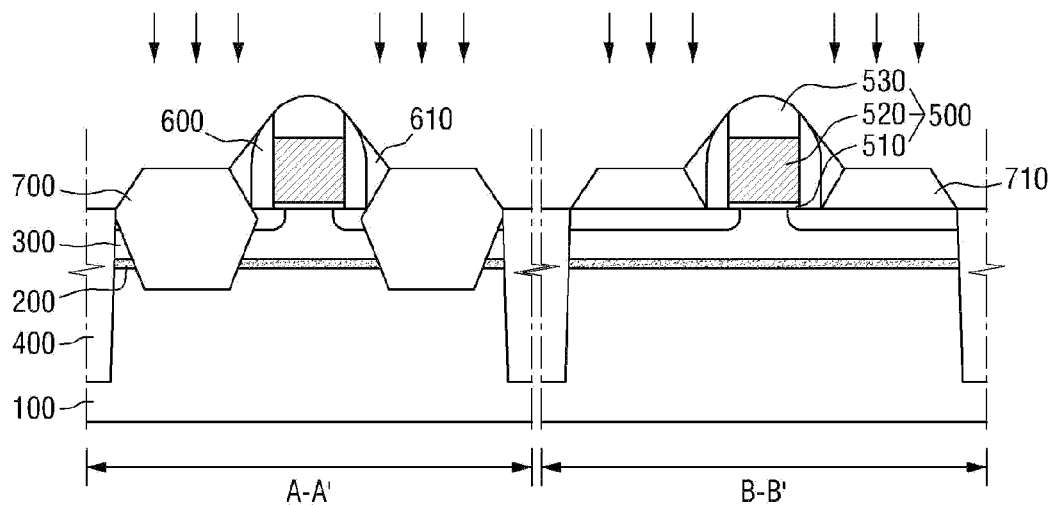

Next, and referring to FIG. 7, a respective first spacer 600 is formed on opposite sides of each of the dummy gate structures constituting the dummy gate pattern 500.

Next, trenches are formed through the first and second epitaxial layers 200, and 300 into the first region (A-A') of the semiconductor substrate 100, on the opposite sides of the first spacer 600 which has been formed on the first region (A-A') of the semiconductor substrate 100. Also, the source/drain 700 of a PMOS transistor is formed by epitaxially growing SiGe, for example, in the trenches. In addition, the source/drain 710 of an NMOS transistor is formed by epitaxially growing Si, for example, on the second epitaxial layer 300 on the opposite sides of the first spacer 600 which has been formed on the second region (B-B') of the semiconductor substrate 100.

Next, a respective second spacer 610 is formed between each of the source/drains 700 and 710 and the first spacer 600 associated therewith.

In the case in which the second spacer 610 is formed in such a manner, ion implantation may be performed to inject impurities into the source/drains 700 and 710 using the dummy gate pattern 500 and the first and second spacers 600 and 610 as a mask. Then, if necessary, an annealing process is performed to cause the injected impurities to diffuse further throughout the structure. Thus, this process/these processes may also be considered as at least part of a halo ion implantation process.

Referring back to FIG. 2, an interlayer dielectric film 800 is formed on the second epitaxial layer 300 in such a way as to expose the top of the dummy gate pattern (500 in FIG. 7). Then, the exposed dummy gate pattern is replaced with metal gate structures 900 and 901. For example, the dummy gate pattern 500 is removed by an etching process. Then, gate insulation film 910 and metal gates 920 and 930 are formed in the spaces previously occupied by the dummy gate pattern 500.

In this embodiment, the first epitaxial layer 200 prevents the pre halo ions injected into the semiconductor substrate 100 (FIG. 3) from diffusing into the first and second active regions AC1 and AC2 (FIG. 1) in the second epitaxial layer 300 (as the result of, for example, an annealing process that follows the injecting of impurities into the source/drains 700 and 710). In particular, the first epitaxial layer 200 formed in the first region I may prevent N-type pre halo ions injected into the semiconductor substrate 100 from diffusing into the first active region AC1 and thereby prevents the pre halo ions from becoming a source for leakage current between the source/drain 700 of the PMOS transistor. Likewise, the first epitaxial layer 200 formed in the second region II may prevent N-type pre halo ions injected into the semiconductor substrate 100 from diffusing into the second active region AC2 and thereby prevents the pre halo ions from becoming a source for leakage current between the source/drain 710 of an NMOS transistor.

Hereinafter, advantages of semiconductor devices according to the inventive concept will be explained with reference to the results plotted in the graphs of FIGS. 8 and 9.

Figure 8:
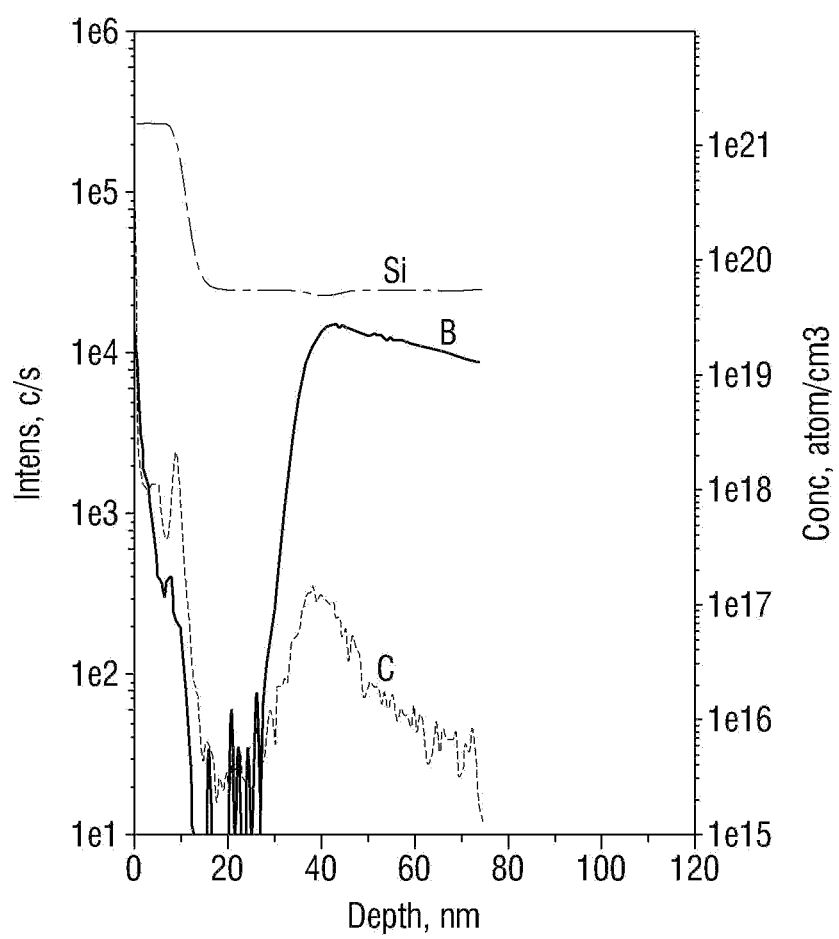
FIG. 8 is a graph illustrating the concentration of silicon (Si), boron (B) and carbon (C) ions in a semiconductor device fabricated with a first epitaxial layer of SiC and a second epitaxial layer of Si in accordance with the inventive concept, in dependence on depth measured from a top surface of the second epitaxial layer.

The graph of FIG. 8 illustrates the concentration distributions (concentrations at different levels or depths) of silicon (Si), boron (B) and carbon (C) of a semiconductor device including both a first epitaxial layer 200 made of SiC and a second epitaxial layer 300 made of Si according to the inventive concept, and in which the pre-halo ions (ions implanted by the pre-halo IIP) were boron (B).

Referring to FIG. 8, the concentration of carbon (C) is highest at a depth of 40 nm, suggesting that the first epitaxial layer 200 made of SiC is formed at approximately 40 nm. Meanwhile, a sharp reduction in the concentration of boron (B) from the depth of approximately 40 nm to the top surface is shown. That is to say, relatively few boron (B) pre-halo ions are present in the channel region of a transistor.

Thus, these results confirm that the first epitaxial layer 200 made of SiC formed at approximately 40 nm from the top surface of the intermediate structure formed at the time the second epitaxial layer 300 has been formed prevents boron (B) from subsequently diffusing upwardly (into the channel of the transistor, for example).

That is, a semiconductor device according to the inventive concept offers a higher degree of reliability and better performance because the boron (B) pre-halo ions will not alter the threshold voltage (Vth) of the transistor or reduce the mobility of charge carriers in the channel.

Figure 9:
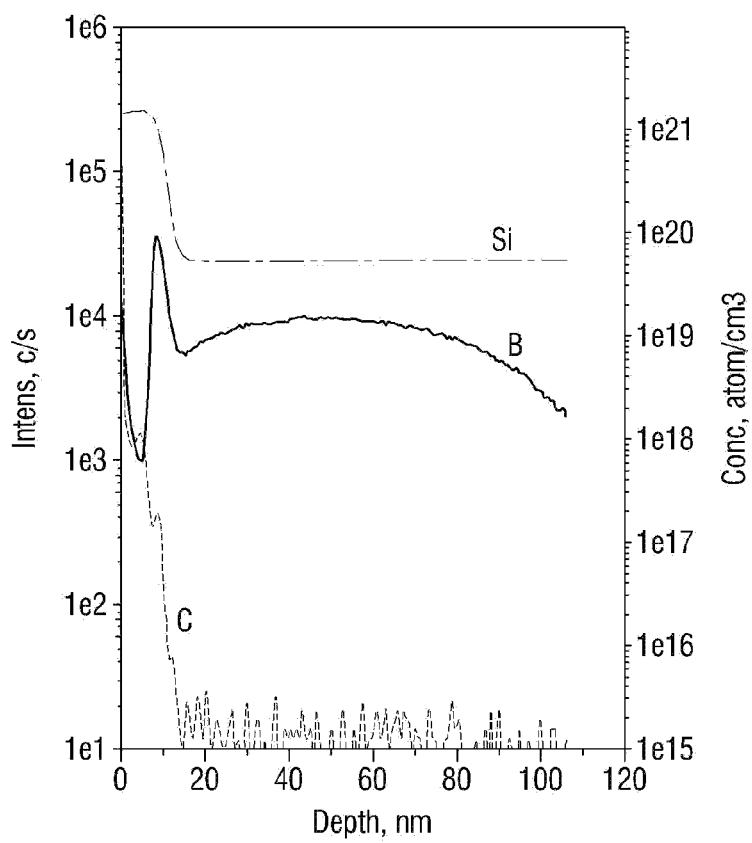
FIG. 9 is a graph illustrating the concentration of silicon (Si), boron (B) and carbon (C) ions in a semiconductor device fabricated with only one epitaxial layer, of Si, as a comparative example, in dependence on depth measured from a top surface of the second epitaxial layer.

In contrast, the graph of FIG. 9 illustrates the concentration distribution of silicon (Si), boron (B) and carbon (C) of a semiconductor device similar to that used to generate the results illustrate in FIG. 8 but fabricated to omit the first epitaxial layer 200 made of SiC, but include a single epitaxial layer of Si corresponding to the second epitaxial layer 300.

Referring to FIG. 9, the concentration of carbon (C) drops rapidly and significantly from the top surface, confirming that a layer corresponding to the first epitaxial layer 200 made of SiC is not formed. Also, boron (B) is shown to be present in a high concentration from a depth of approximately 10 nm to a depth of approximately 40 nm.

Therefore, the boron (B) has diffused widely throughout the channel region of the transistor this semiconductor device. Accordingly, boron (B) pre-halo ions will cause the threshold voltage (Vth) of the transistor to degrade or reduce the mobility of carriers in the channel of this semiconductor device, i.e., a device without the first epitaxial layer 200 of SiC.

Next, another embodiment of a semiconductor device according to the inventive concept will be described with reference to FIG. 10.

Figure 10:
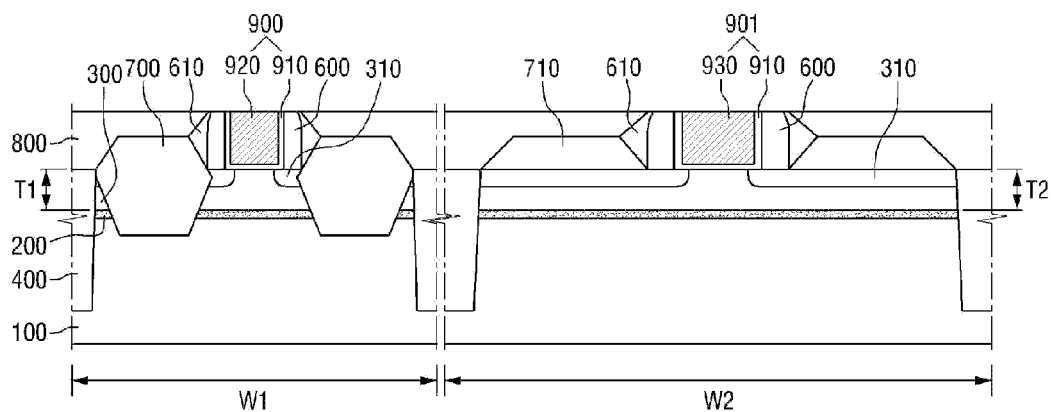
FIG. 10 is a cross-sectional view of a second embodiment of a semiconductor device according to the inventive concept.

Referring to FIG. 10, a first active region of the semiconductor where one transistor is provided and a second active region of the semiconductor device where another transistor is provided have different widths W1 and W2. For example, the first active region of the device where the PMOS transistor is provided may be narrower than the second active region where the NMOS transistor is provided. However, this embodiment is not limited to a PMOS transistor being provided at the narrower active region.

Furthermore, a first epitaxial layer 200 made of, for example, SiC, for preventing halo ions in the semiconductor substrate 100 (e.g., boron (B)) from diffusing into the first and second active regions, extends beneath the first and second active regions.

Also, in this embodiment, the thickness T1 of the second epitaxial layer 300 having the first active region defined therein and the thickness T2 of the second epitaxial layer 300 having the second active region defined therein may be equal to each other.

The semiconductor device of the present embodiment may have active regions having different widths W1 and W2 but equal thicknesses T1 and T2, as described above, because the second epitaxial layer 300 is epitaxially grown across the entire surface of the first epitaxial layer 200, rather than being selectively epitaxially grown. In other words, the second epitaxial layer 300 according to this embodiment does not exert a loading effect because it is not subjected to selective epitaxial growth. Therefore, the respective thicknesses of the active regions defined in the second epitaxial layer 300 are established irrespective of the widths of the regions atop which the second epitaxial layer 300 is to be formed and hence, the thicknesses of the active regions may be made uniform.

Figure 11:
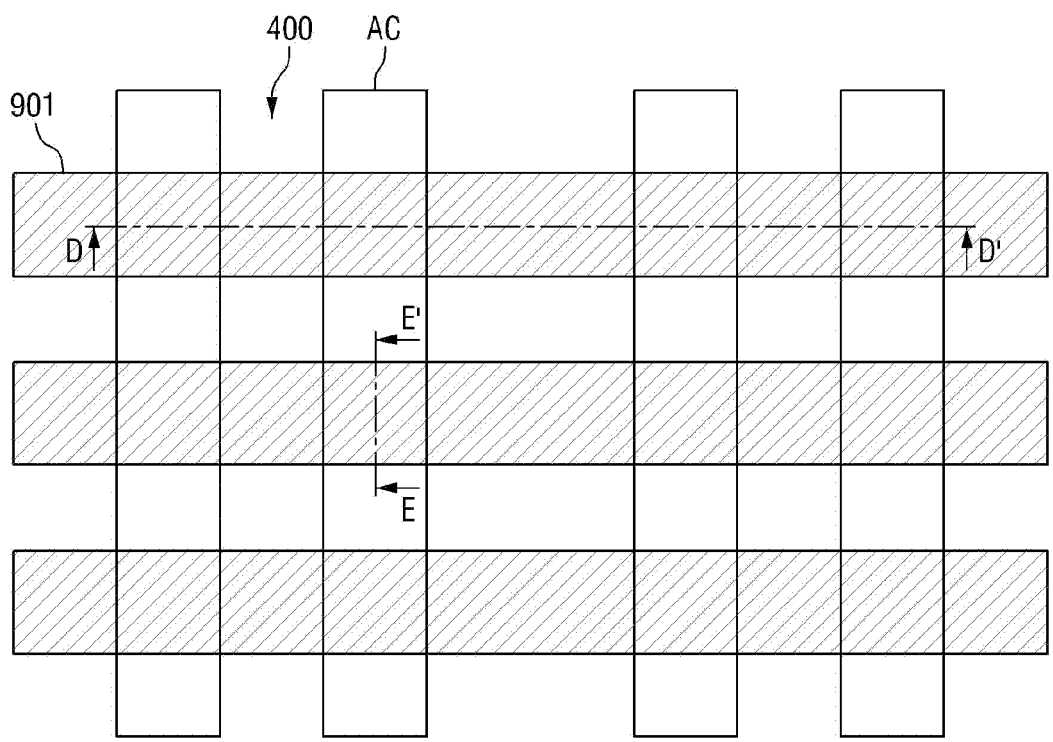
FIG. 11 is a conceptual layout diagram of the second embodiment of a semiconductor device according to the inventive concept.
Figure 12:
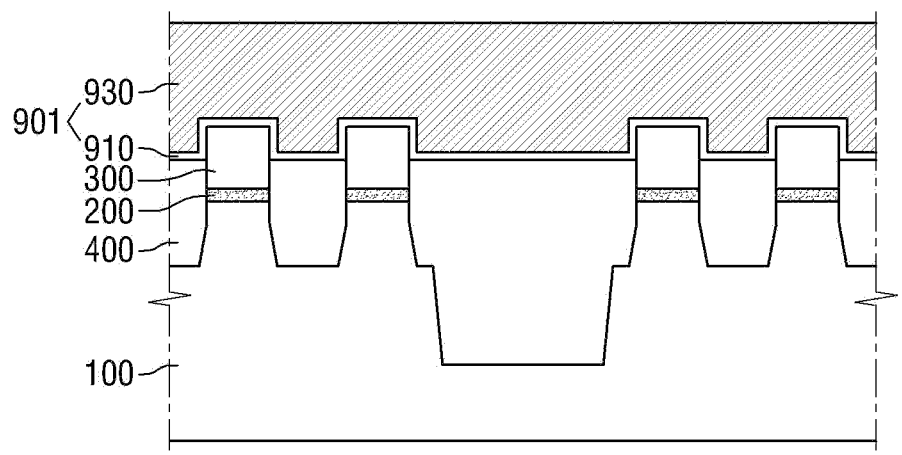
FIG. 12 is a cross-sectional view taken along line D-D' of FIG. 11.

Next, another embodiment of a semiconductor device according to the inventive concept will be described with reference to FIGS. 11 to 13.

The semiconductor device may include isolation film 400 defining active regions (AC) extending parallel to one another in a first direction (in the Y direction in FIG. 11), and a metal gate structure 901 and extending over the active regions AC in a second direction (in the X direction) intersecting the first direction.

In this embodiment, the top surface of the active regions AC, that is, a top surface of the second epitaxial layer 300, is higher than the top surface of the isolation film 400. That is to say, in this embodiment, the active regions AC defined in the second epitaxial layer 300 each have the shape of a fin protruding from the semiconductor substrate 100. The metal gate structure 901 may conform to the top surface of the isolation film 400, side surfaces of the second epitaxial layer 300 having the active regions defined therein, and the top surface of the second epitaxial layer 300.

Furthermore, in this embodiment, the height of the fins (constituted by the second epitaxial layer 300) depends on the thickness to which the isolation film 400 is formed.

The method of fabricating of the semiconductor device can be easily inferred from the previously described method and so, a detailed description thereof will not be made.

Figure 13:
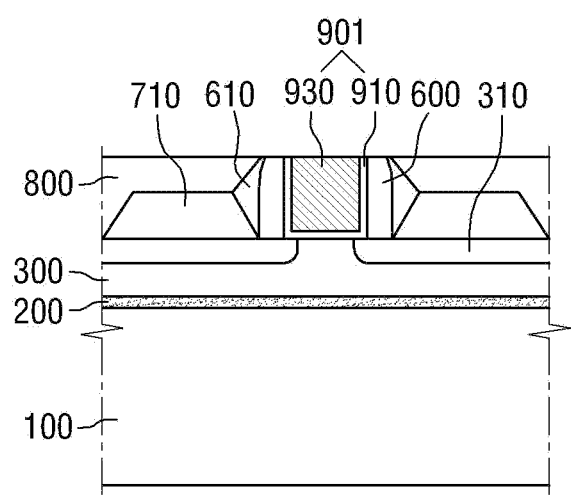
FIG. 13 is a cross-sectional view taken along line E-E' of FIG. 11.

Furthermore, NMOS transistors may be formed at the active regions AC defined in the second epitaxial layer 300, as can be seen from FIG. 13. However, PMOS transistors may be formed at the active regions AC instead, or NMOS transistors may be formed at some of active regions AC and PMOS transistors may be formed at others of the active regions AC.

Figure 14:
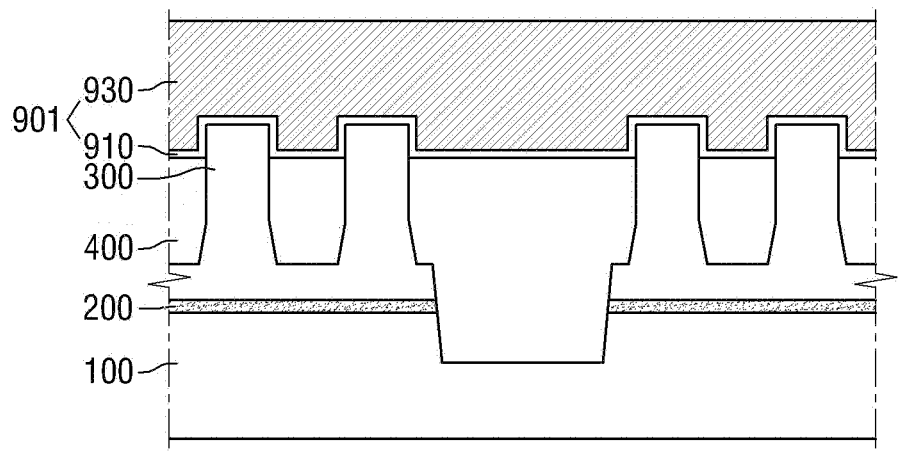
FIGS. 14 and 15 are cross-sectional views of still another embodiment of a semiconductor device according to the inventive concept.
Figure 15:
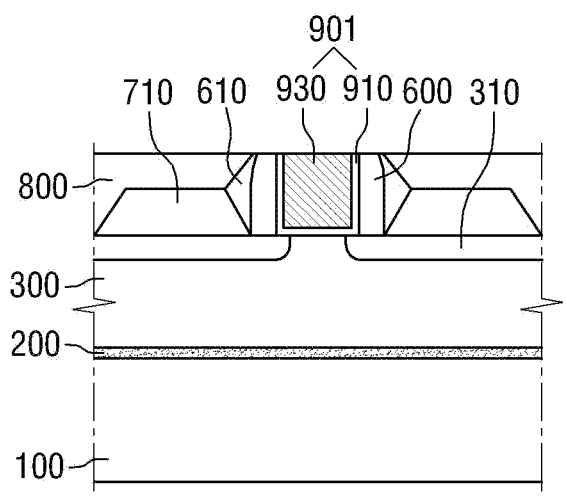

Hereinafter, another embodiment of a semiconductor device according to the inventive concept will be described with reference to FIGS. 14 and 15.

In this embodiment, first epitaxial layer 200 extends beneath isolation film 400. That is, the top surface of the first epitaxial layer 200 extends at a level beneath that of the bottom surface of the isolation film 400.

This embodiment of a semiconductor device according to the inventive concept may be fabricated by forming second epitaxial layer on the first epitaxial layer 200 to a relatively great thickness, and forming the isolation film 400 in the second epitaxial layer 300 to such a depth so small as to not penetrate the first epitaxial layer 200.

Finally, embodiments of the inventive concept and examples thereof have been described above in detail. The inventive concept may, however, be embodied in many different forms and should not be construed as being limited to the embodiments described above. Rather, these embodiments were described so that this disclosure is thorough and complete, and fully conveys the inventive concept to those skilled in the art. Thus, the true spirit and scope of the inventive concept is not limited by the embodiment and examples described above but by the following claims.

What is claimed is:

1. A method of fabricating a semiconductor device, the method comprising:
    implanting ions into a semiconductor substrate in a pre-halo ion implantation process;
    epitaxially growing a layer of material on the entirety of an upper surface of the semiconductor substrate to thereby form a first epitaxial layer;
    epitaxially growing a layer of material on the entirety of an upper surface of the first epitaxial layer to thereby form a second epitaxial layer; and
    forming a transistor on an active region defined in the second epitaxial layer, wherein the forming of the transistor comprises:
    forming a dummy gate structure on the active region;
    forming a source/drain on opposite sides of the dummy gate structure by an epitaxial growth process,
    forming an interlayer dielectric film on the second epitaxial layer, wherein the interlayer dielectric film exposes the top of the dummy gate structure, and
    replacing the exposed dummy gate structure with a metal gate structure, and
    wherein the first epitaxial layer prevents the ions implanted in the semiconductor substrate in the pre-halo ion implantation process from diffusing into the second epitaxial layer.

2. The method of claim 1, wherein the pre-halo ion implantation process is performed before the first epitaxial layer is formed.

3. The method of claim 1, wherein each of the first and second epitaxial layers contains silicon (Si).

4. The method of claim 3, wherein the first epitaxial layer is a layer of silicon carbide (SiC), and the second epitaxial layer is a layer of silicon (Si).

5. The method of claim 1, further comprising forming an isolation film through the second epitaxial layer and such that the top surface of the second epitaxial layer and the top surface of the isolation film are coplanar.

6. The method of claim 1, wherein the transistor is an NMOS transistor, and the ions implanted in the pre-halo ion implantation process are boron (B) ions.

7. A method of fabricating a semiconductor device, the method comprising:
    implanting ions into a semiconductor substrate in a pre-halo ion implantation process;
    sequentially forming a first epitaxial layer and a second epitaxial layer on the semiconductor substrate by epitaxial growth processes;
    after the second epitaxial layer has been formed, forming an isolation film recessed in the second epitaxial layer to define at least one active region in the second epitaxial layer, the top surface of the active region being situated at a level higher than that of the top surface of the isolation film; and
    forming at least one transistor at the at least one active region,
    wherein the first epitaxial layer prevents the ions implanted in the semiconductor substrate in the pre-halo ion implantation process from diffusing into the second epitaxial layer.

8. The method of claim 7, wherein the isolation film is formed to penetrate the first epitaxial layer.

9. The method of claim 7, wherein the isolation film and the first epitaxial layer are formed such that a bottom surface of the isolation film is situated at a level higher than that of the top surface of the first epitaxial layer.

10. The method of claim 7, wherein the forming of the isolation film defines a first active region and a second active region in the second epitaxial layer, and the forming of the at least one transistor comprises forming a PMOS transistor at the first active region and forming an NMOS transistor at the second active region.

11. The method of claim 10, wherein the first active region is formed to be narrower than the second active region in a horizontal direction parallel to an upper surface of the substrate, and the second epitaxial layer and the isolation film are formed such that the thickness of the first active region and the thickness of the second active region defined by the isolation film in the second epitaxial layer are equal to each other.

12. The method of claim 7, wherein the forming of the transistor includes forming a metal gate structure whose bottom portion conforms to the topography of the top surface of the isolation film, side surfaces of the active region and the top surface of the active region.

13. The method of claim 7, wherein the forming of the first epitaxial layer comprises forming a layer of silicon carbide (SiC), the forming of the second epitaxial layer comprises forming a layer of silicon (Si), the pre-halo ion implantation process comprises injecting boron (B) ions into the substrate, and the forming of the at least one transistor comprises forming an NMOS transistor at the active region.

14. A method of fabricating a semiconductor device, the method comprising:
- a pre-halo ion implantation process comprising implanting boron (B) ions as P-type impurities into a first region of a semiconductor substrate over which an NMOS transistor is to be subsequently formed, and implanting N-type impurities into a second region of the semiconductor substrate over which the PMOS transistor is to be subsequently formed;
- epitaxially growing a silicon carbide (SiC) layer of material on an upper surface of the semiconductor substrate, and epitaxially growing a layer of silicon (Si) on the SiC layer after the pre-halo ion implantation process has been carried out;
- forming an isolation film that divides the epitaxially grown Si layer into a plurality of active regions,
- forming the PMOS transistor at one of the active regions including by forming a first dummy gate structure over part of the epitaxially grown Si layer constituting a channel region of the PMOS transistor, forming a source/drain region of the PMOS transistor adjacent opposite sides of the first dummy gate structure by performing a halo ion implantation process to inject impurities into said one of the active regions, forming trenches in said one of the active regions, and epitaxially growing material constituting a source/drain of the PMOS transistor in the trenches, and subsequently removing the first dummy gate structure from said one of the active regions and forming a gate structure in its place over the channel region of the PMOS transistor;
- forming the NMOS transistor at another of the active regions of the epitaxially grown Si layer including by forming a second dummy gate structure over part of the epitaxially grown Si layer constituting a channel region of the NMOS transistor, forming a source/drain of the NMOS transistor adjacent opposite sides of the second dummy gate structure by performing a halo ion implantation process to inject impurities into said another of the active regions, and subsequently removing the dummy gate structure from said one of the active regions and forming a gate structure in its place over the channel region of the NMOS transistor, and
- wherein the epitaxially grown first layer prevents the ions implanted in the semiconductor substrate in the pre-halo ion implantation process from diffusing into the part of the epitaxially grown Si layer constituting the channel regions at least from the time that the epitaxially grown Si layer has been formed to the time the transistors have been formed.

15. The method of claim 14, wherein the Si layer is formed to a thickness greater than that of the SiC layer.

* * * * *